US012777802B2

(12) United States Patent
Wang et al.

(10) Patent No.: US 12,777,802 B2
(45) Date of Patent: Oct. 27, 2026

(54) ARRAY SUBSTRATE AND DISPLAY APPARATUS

(71) Applicants: Chongqing BOE Display Technology Co.,Ltd., Chongqing (CN); BOE TECHNOLOGY GROUP CO., LTD., Beijing (CN)

(72) Inventors: Rui Wang, Beijing (CN); Chao Zeng, Beijing (CN); Yuanyou Qiu, Beijing (CN); Ming Hu, Beijing (CN); Weishu Wen, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 1029 days.

(21) Appl. No.: 17/914,584

(22) PCT Filed: Sep. 24, 2021

(86) PCT No.: PCT/CN2021/120354

§ 371 (c)(1),
(2) Date: Sep. 26, 2022

(87) PCT Pub. No.: WO2023/044763

PCT Pub. Date: Mar. 30, 2023

(65) Prior Publication Data

US 2024/0389415 A1 Nov. 21, 2024

(51) Int. Cl.
*H10K 59/131* (2023.01)

(52) U.S. Cl.
CPC ................................ *H10K 59/1315* (2023.02)

(58) Field of Classification Search
CPC ............. H10K 59/1315; G09G 3/3258; G09G 2300/0426; H01L 23/5286
See application file for complete search history.

(56) References Cited

U.S. PATENT DOCUMENTS

| | | | | |
|---|---|---|---|---|
| 2017/0316140 | A1 | 11/2017 | Kim et al. | |
| 2019/0096924 | A1* | 3/2019 | Ren ...................... | H10D 86/423 |
| 2020/0144351 | A1 | 5/2020 | Liu et al. | |
| 2020/0243637 | A1 | 7/2020 | Lee et al. | |
| 2020/0328268 | A1 | 10/2020 | Kim et al. | |
| 2021/0083037 | A1 | 3/2021 | Kim et al. | |
| 2021/0181568 | A1 | 6/2021 | Abe et al. | |
| 2021/0225982 | A1 | 7/2021 | Yi | |
| 2022/0393085 | A1 | 12/2022 | Cheng et al. | |
| 2023/0079023 | A1* | 3/2023 | Lee ...................... | H10K 59/131 257/40 |

FOREIGN PATENT DOCUMENTS

| | | |
|---|---|---|
| CN | 107863373 A | 3/2018 |
| CN | 111081739 A | 4/2020 |

* cited by examiner

*Primary Examiner* — Eric K Ashbahian
(74) *Attorney, Agent, or Firm* — Dority & Manning, P.A.

(57) ABSTRACT

An array substrate has a display area and a peripheral area. The array substrate includes a substrate, a first common voltage line disposed on a first side of the substrate, and a voltage signal introduction structure disposed on the first side of the substrate. The first common voltage line is located in the peripheral area and arranged along at least part of a boundary of the display area. The voltage signal introduction structure is electrically connected to at least one position except two ends of the first common voltage line, so as to input a voltage signal to the first common voltage line.

12 Claims, 6 Drawing Sheets

ARRAY SUBSTRATE AND DISPLAY APPARATUS

CROSS-REFERENCE TO RELATED APPLICATION

This application is a national phase entry under 35 USC 371 of International Patent Application No. PCT/CN2021/120354, filed on Sep. 24, 2021, which is incorporated herein by reference in its entirety.

TECHNICAL FIELD

The present disclosure relates to the field of display technologies, and in particular, to an array substrate and a display apparatus.

BACKGROUND

Organic light-emitting diode (OLED) display panels have gradually become one of mainstreams in the display field due to their excellent performance such as low power consumption, high color saturation, wide viewing angle, small thickness and flexibility.

At present, more and more OLED display panels each adopt a narrow-bezel design to achieve purposes of beautifying a bezel thereof and increasing a display area.

SUMMARY

In an aspect, an array substrate is provided. The array substrate has a display area and a peripheral area. The array substrate includes a substrate, a first common voltage line disposed on a first side of the substrate, and a voltage signal introduction structure disposed on the first side of the substrate. The first common voltage line is located in the peripheral area and arranged along at least part of a boundary of the display area. The voltage signal introduction structure is electrically connected to at least one position except two ends of the first common voltage line, so as to input a voltage signal to the first common voltage line.

In some embodiments, the two ends of the first common voltage line are located on a same side of the display area. The two ends of the first common voltage line are both signal input terminals. The first common voltage line includes a first portion, and the first portion is located on a side of the display area away from the two ends. The voltage signal introduction structure is electrically connected to at least one position of the first portion.

In some embodiments, the voltage signal introduction structure includes at least one first auxiliary voltage line passing through the display area. In the at least one first auxiliary voltage line, a first end of a first auxiliary voltage line is electrically connected to the first portion, and a second end of the first auxiliary voltage line is located on the same side of the display area as the two ends of the first common voltage line.

In some embodiments, the voltage signal introduction structure further includes a first conductive connection portion located between the first portion and the display area. The first end of the first auxiliary voltage line is electrically connected to the first portion through the first conductive connection portion.

In some embodiments, the first conductive connection portion includes a first connection line and a plurality of second connection lines. The first connection line and the first portion are arranged at an interval. The plurality of second connection lines are each connected between the first connection line and the first portion. The first end of the first auxiliary voltage line is connected to the first connection line.

In some embodiments, the plurality of second connection lines are arranged at equal intervals along an extension direction of the first portion.

In some embodiments, the voltage signal introduction structure further includes at least one second auxiliary voltage line extending in a same direction as the first portion. The first common voltage line further includes a second portion and a third portion that are disposed opposite to each other; in the at least one second auxiliary voltage line, a first end of a second auxiliary voltage line is connected to a second connection line in the plurality of second connection lines, and a second end of the second auxiliary voltage line is connected to the second portion or the third portion.

In some embodiments, the voltage signal introduction structure further includes a second conductive connection portion located between the two ends of the first common voltage line. The second end of the first auxiliary voltage line is electrically connected to the second conductive connection portion.

In some embodiments, the second conductive connection portion includes a connection segment and a plurality of voltage signal input segments. The connection segment is located on a side of the display area away from the first portion. The plurality of voltage signal input segments each are connected to the connection segment and each extend to a side away from the display area. The second end of the first auxiliary voltage line is connected to the connection segment.

In some embodiments, the voltage signal introduction structure further includes at least one third auxiliary voltage line passing through the display area and crossing the first auxiliary voltage line. The first common voltage line further includes a second portion and a third portion that are disposed opposite to each other; in the at least one third auxiliary voltage line, a first end of a third auxiliary voltage line is connected to the second portion, and a second end of the third auxiliary voltage line is connected to the third portion.

In some embodiments, the third auxiliary voltage line and the first auxiliary voltage line are electrically connected at a crossing position.

In some embodiments, the first auxiliary voltage line and the third auxiliary voltage line are disposed in a same layer as the first common voltage line. Alternatively, the first auxiliary voltage line and the third auxiliary voltage line are disposed in a different layer from the first common voltage line.

In some embodiments, the at least one first auxiliary voltage line includes a plurality of first auxiliary voltage lines, part of the first auxiliary voltage lines are disposed in a same layer as the first common voltage line, and remaining part of the first auxiliary voltage lines are disposed in a different layer from the first common voltage line; or the at least one third auxiliary voltage line includes a plurality of third auxiliary voltage lines, part of the third auxiliary voltage lines are disposed in the same layer as the first common voltage line, and remaining part of the third auxiliary voltage lines are disposed in a different layer from the first common voltage line; or the part of the first auxiliary voltage lines are disposed in the same layer as the first common voltage line, and the remaining part of the first auxiliary voltage lines are disposed in the different layer from the first common voltage line, the part of the third auxiliary voltage lines are disposed in the same layer as the first common voltage line, and the remaining part of the third auxiliary voltage lines are disposed in the different layer from the first common voltage line.

In some embodiments, the array substrate further includes a circuit structure layer, an anode layer and a light-shielding metal layer. The circuit structure layer is located on the first side of the substrate, and includes at least one conductive layer. The anode layer is located on a side of the circuit structure layer away from the substrate. The light-shielding metal layer is located between the circuit structure layer and the substrate. The first common voltage line is disposed in a same layer as any one of the at least one conductive layer and the anode layer. A first auxiliary voltage line in the at least one first auxiliary voltage line or a third auxiliary voltage line in the at least one third auxiliary voltage line disposed in a different layer from the first common voltage line is disposed in a same layer as the light-shielding metal layer.

In some embodiments, the display area includes a plurality of sub-pixel regions arranged in a plurality of rows and a plurality of columns. The first auxiliary voltage line and the third auxiliary voltage line each pass through the display area through gaps between sub-pixel regions in the plurality of sub-pixel regions.

In some embodiments, the at least one first auxiliary voltage line includes a plurality of first auxiliary voltage lines, the plurality of first auxiliary voltage lines are arranged at equal intervals along a row direction of the plurality of sub-pixel regions; or the at least one third auxiliary voltage line includes a plurality of third auxiliary voltage lines, the plurality of third auxiliary voltage lines are arranged at equal intervals along a column direction of the plurality of sub-pixel regions; or the plurality of first auxiliary voltage lines are arranged at equal intervals along the row direction of the plurality of sub-pixel regions, and the plurality of third auxiliary voltage lines are arranged at equal intervals along the column direction of the plurality of sub-pixel regions.

In some embodiments, the first common voltage line includes a first portion, and the first portion is located on a side of the display area away from the two ends. The voltage signal introduction structure includes at least one connection block. The at least one connection block is located on a side of the first portion away from the display area, and connected to the first portion, a connection block in the at least one connection block being configured to be connected to an external voltage signal source.

In some embodiments, the at least one connection block includes a plurality of connection blocks, the connection blocks are connected to different positions of the first portion, and the connection blocks are arranged at equal intervals along an extension direction of the first portion.

In another aspect, a display apparatus is provided. The display apparatus includes the array substrate according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
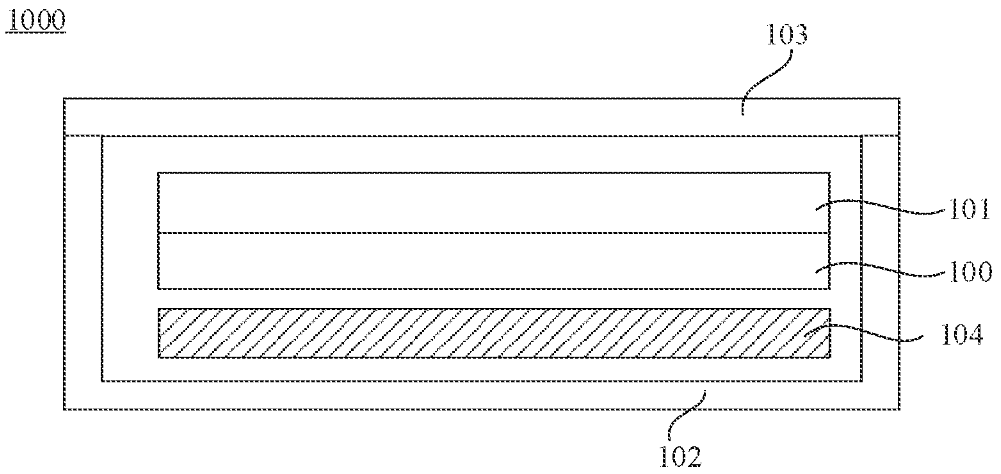
FIG. 1 is a longitudinal sectional view showing a structure of a display apparatus, in accordance with some embodiments.

Technical solutions in some embodiments of the present disclosure will be described clearly and completely with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representation of the above term does not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of the measurement in question and errors associated with the measurement of a particular quantity (i.e., limitations of the measurement system). The term "parallel" includes absolute parallelism and approximate parallelism, and an acceptable range of deviation of the approximate parallelism may be, for example, a deviation within 5°. The term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals being less than or equal to 5% of either of the two equals.

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown to have a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

Some embodiments of the present disclosure provide a display apparatus. Referring to FIG. 1, the display apparatus 1000 includes an array substrate 100.

Referring to FIG. 1, the display apparatus 1000 includes the array substrate 100, a light-emitting device layer 101, a housing 102, a cover plate 103, and a circuit board 104, etc.

A longitudinal section of the housing 102 may be U-shaped, and the array substrate 100, the light-emitting device layer 101, the circuit board 104 and other accessories are all disposed in the housing 102. The circuit board 104 is disposed on a side of the array substrate 100, the light-emitting device layer 101 is disposed on a side of the array substrate 100 away from the circuit board 104, and the cover plate 103 is disposed on a side of the light-emitting device layer 101 away from the array substrate 100.

Figure 2:
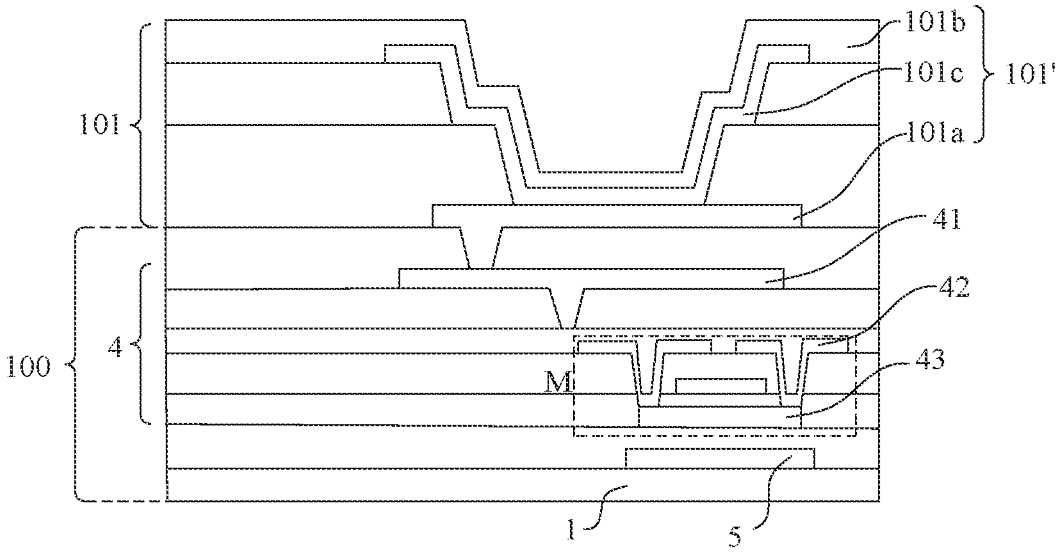
FIG. 2 is a longitudinal sectional view showing structures of a light-emitting device layer and an array substrate, in accordance with some embodiments.

Referring to FIG. 2, FIG. 2 is a longitudinal sectional view showing the light-emitting device layer 101 and the array substrate 100. In some examples, the light-emitting device layer 101 includes a plurality of light-emitting devices 101' (i.e., organic light-emitting diodes (OLEDs)). Each light-emitting device 101' includes a first electrode 101*a*, a second electrode 101*b*, and a light-emitting layer 101*c* disposed between the first electrode 101*a* and the second electrode 101*b*.

In some examples, the first electrode 101*a* is an anode, and the second electrode 101*b* is a cathode. In some other examples, the first electrode 101*a* is a cathode, and the second electrode 101*b* is an anode.

In some examples, in addition to the light-emitting layer 101*c*, the light-emitting device 101' further includes one or more of an electron transport layer (ETL), an electron injection layer (EIL), a hole transport layer (HTL) and a hole injection layer (HIL), so as to improve light-emitting efficiency of the light-emitting device 101'.

In some examples, an encapsulation layer (not shown in the figure) is further provided on a side of the light-emitting device 101' away from the array substrate 100. The encapsulation layer is used to cover the light-emitting device 101', so as to wrap the light-emitting device 101', which prevents a service life of the light-emitting device 101' from being shortened due to water vapor and oxygen in an external environment entering the light-emitting device 101' and damaging an organic material in the light-emitting device 101'.

It will be noted that, the type of the display apparatus 1000 may vary. For example, the display apparatus 1000 may be an OLED display apparatus, a quantum dot light-emitting diode (QLED) display apparatus, or a light-emitting diode (LED) display apparatus. The OLED display apparatus may be, for example, an active matrix organic light-emitting diode (AMOLED) display apparatus.

The product form of the display apparatus 1000 may also vary. For example, the display apparatus 1000 may be any apparatus that displays images whether in motion (e.g., videos) or stationary (e.g., static images), and whether literal or graphical. More specifically, the display apparatus 1000 may be disposed in or associated with a variety of electronic apparatuses. The variety of electronic apparatuses may include (but are not limited to), for example, mobile phones, wireless apparatuses, personal data assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat panel displays, computer monitors, automobile displays (e.g., odometer displays), navigators, cockpit controllers and/or cockpit displays, camera view displays (e.g., displays of rear-view cameras in vehicles), electronic photos, electronic billboards or signs, projectors, architectural structures, packaging and aesthetic structures (e.g., displays for displaying an image of a piece of jewelry).

Referring to FIGS. 3 to 8, some embodiments of the present disclosure provide an array substrate 100, which may be applied to the display apparatus 1000. Of course, the array substrate 100 may also be applied to other apparatuses.

In some embodiments, referring to FIGS. 3 to 5 and 8, the array substrate 100 has a display area AA and a peripheral area BB.

It will be noted that, a position of the peripheral area BB is not limited in embodiments of the present disclosure. For example, the peripheral area BB may be located on one side, two sides or three sides of the display area AA. As another example, the peripheral area BB may also be arranged around the display area AA.

In some examples, with continued reference to FIGS. 3 to 5 and 8, a cross section of the array substrate 100 is substantially in a rectangular shape. Of course, in some other examples, the cross section of the array substrate 100 may also be circular-shaped, heart-shaped, or in other irregular shape.

With continued reference to FIGS. 3 to 5 and 8, the array substrate 100 includes a substrate 1, and a first common voltage line 2 and a voltage signal introduction structure 3 that are disposed on a first side of the substrate 1. The first common voltage line 2 is located in the peripheral area BB and arranged along at least part of a boundary of the display area AA. The voltage signal introduction structure 3 is electrically connected to at least one position except two ends D of the first common voltage line 2, so as to input a voltage signal to the first common voltage line 2.

It can be understood that, the first common voltage line 2 is a VSS voltage line, i.e., a cathode common voltage line, which is used to provide a VSS voltage for the cathode (e.g., the first electrode 101*a* or the second electrode 101*b*) of the light-emitting device. The first common voltage line 2 may be arranged along one or more sides of the display area AA. For example, with continued reference to FIGS. 3 to 5 and 8, the first common voltage line 2 is arranged around three sides of the display area AA.

At present, more and more array substrates adopt a narrow-bezel structure. The inventors of the present disclosure have found through research that, since the cathode common voltage line is disposed in the peripheral area, in a case where the peripheral area is narrowed, a width of the cathode common voltage line is reduced. A decrease in the width of the cathode common voltage line may lead to an increase in a resistance of the cathode common voltage line, so that a voltage drop (IR drop) of the cathode common voltage line may increase. That is, the farther a position of the cathode common voltage line is from a signal input terminal of the cathode common voltage line, the lower a current is at the position of the cathode common voltage line. In order to ensure that the current at the position of the cathode common voltage line away from the signal input terminal reaches a set value, it is required to input a large voltage signal at the signal input terminal to generate a high current. In a case where the high current is input from the signal input terminal of the cathode common voltage line, a large amount of heat may be generated at this position of the array substrate, which may bring a burning risk to structures at this position. In addition, the farther the position of the cathode common voltage line is from the signal input terminal of the cathode common voltage line, the larger the IR drop is, and the lower the current is. Therefore, the farther a light-emitting device is from the signal input terminal, the lower a brightness of the light-emitting device is, resulting in poor uniformity of long-range brightness of the display apparatus.

However, for the array substrate 100 provided in the embodiments of the present disclosure, since the voltage signal introduction structure 3 is electrically connected to the cathode common voltage line, the voltage signal introduction structure 3 may input the voltage signal to the cathode common voltage line from positions thereof, which may ameliorate defects caused by inputting the current from one end. By arranging the voltage signal introduction structure 3, it may be possible to reduce the current at the signal input terminal of the cathode common voltage line, so as to ameliorate the problem of serious heat generation at this position of the array substrate. In addition, the voltage signal introduction structure 3 may also improve uniformity of currents at the positions of the cathode common voltage line, thereby ameliorating the problem of poor uniformity of the long-range brightness of the display apparatus.

In some embodiments, with continued reference to FIGS. 3 to 5 and 8, the two ends D of the first common voltage line 2 are located on the same side of the display area AA. The two ends D of the first common voltage line 2 are both signal input terminals. The first common voltage line 2 includes a first portion 21 located on a side of the display area AA away from the two ends D. The voltage signal introduction structure 3 is electrically connected to at least one position of the first portion 21.

It can be seen from the above content that, there is an IR drop on the first common voltage line 2. It can be understood that, the farther a position of the first common voltage line 2 is from the end D, the larger the IR drop is, and the lower the current is. That is, the first portion 21 of the first common voltage line 2 is at positions where the IR drop is maximum and the current is minimum. Therefore, by providing the voltage signal introduction structure 3 electrically connected to the first portion 21, it may be possible to ameliorate a problem of low currents at the positions, thereby improving uniformity of currents at positions of the array substrate 100, and improving uniformity of the long-range brightness of the array substrate 100.

In some examples, with continued reference to FIGS. 3 to 5 and 8, the array substrate 100 is further provided with VDD signal lines 11 therein. The VDD signal lines 11 include display area VDD signal lines 111 located in the display area AA and peripheral area VDD signal line(s) 112 located in the peripheral area BB. The display area VDD signal line 111 is electrically connected to pixel driving circuits of sub-pixels, and is used to provide a VDD signal for the pixel driving circuits. The peripheral area VDD signal line 112 is electrically connected to the display area VDD signal lines 111. The array substrate 100 is further provided with bonding pads 12, which are used for being connected to a flexible printed circuit (FPC). The two ends D of the first common voltage line 2 and the peripheral area VDD signal line(s) 112 are electrically connected to respective bonding pads 12, and are used to receive the VSS signal or the VDD signal from the outside.

In some examples, with continued reference to FIGS. 3 to 5 and 8, the array substrate 100 further has a fan-out area 13. The fan-out area 13 and the two ends D of the first common voltage line 2 are located on the same side of the display area. Lead-out portions of data lines 131 are in the fan-out area 13.

In some examples, the array substrate 100 further includes a cell test circuit 14. The cell test circuit 14 is used to perform a panel function test. The defect of the panel is detected through the panel function test, so that defective products are easily removed.

In some examples, the array substrate 100 further includes a driver integrated circuit (IC) 15. The driver IC is used to receive and send signals to drive the array substrate 100 to operate.

In some examples, with continued reference to FIGS. 3 to 5 and 8, the array substrate 100 is further provided with a shift register circuit 16 therein. For example, the shift register circuit 16 may include a scan signal shift register circuit (i.e., gate driver on array (Gate GOA)) for providing scan signals, or an enable signal shift register circuit (i.e., EM driver on array (EM GOA)) for providing enable signals, or the scan signal shift register circuit for providing the scan signals and the enable signal shift register circuit for providing the enable signals. The shift register circuit 16 is electrically connected to pixel driving circuits in the display area AA through signal lines 161 to provide the enable signals or the scan signals to the pixel driving circuits. In FIGS. 3 to 5 and 8, the shift register circuit 16 is disposed on two sides of the display area AA, and located on a side of the first common voltage line 2 proximate to the display area AA. However, an arrangement of the shift register circuit 16 is not limited thereto. For example, the shift register circuit 16 may be disposed on only one side of the display area AA.

In some examples, with continued reference to FIGS. 3 to 5 and 8, the array substrate 100 is further provided with initialization signal lines 17 therein, which are used for transmitting an initialization signal. The initialization signal lines 17 include peripheral area initialization signal line(s) 171 disposed in the peripheral area BB and display area initialization signal lines 172 disposed in the display area AA. The display area initialization signal lines 172 are electrically connected to the pixel driving circuits and the peripheral area initialization signal lines 171, so as to transmit the signal on the peripheral area initialization signal line(s) 171 to the pixel driving circuits.

Figure 3:
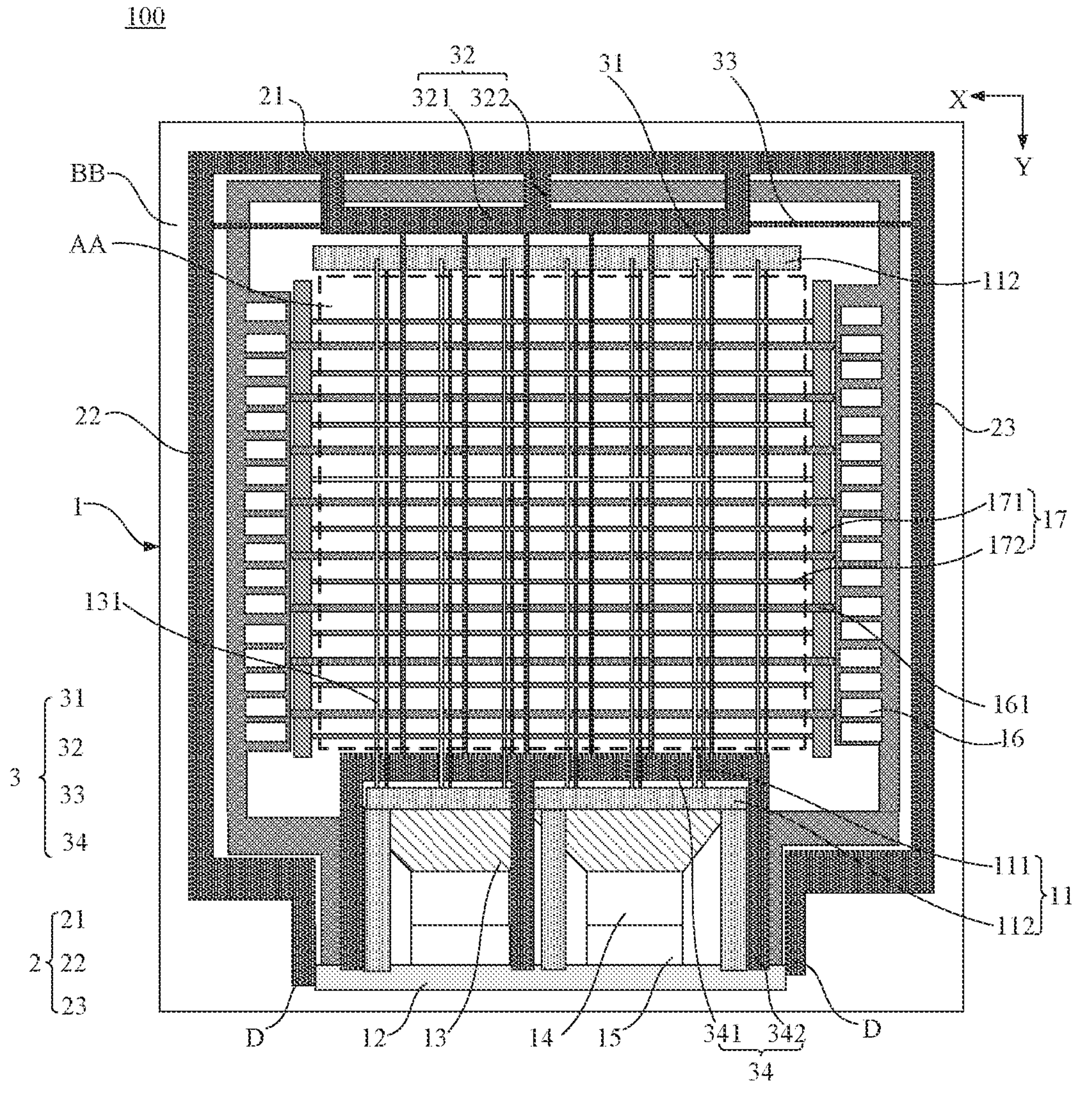
FIG. 3 is a structural diagram of an array substrate, in accordance with some embodiments.
Figure 4:
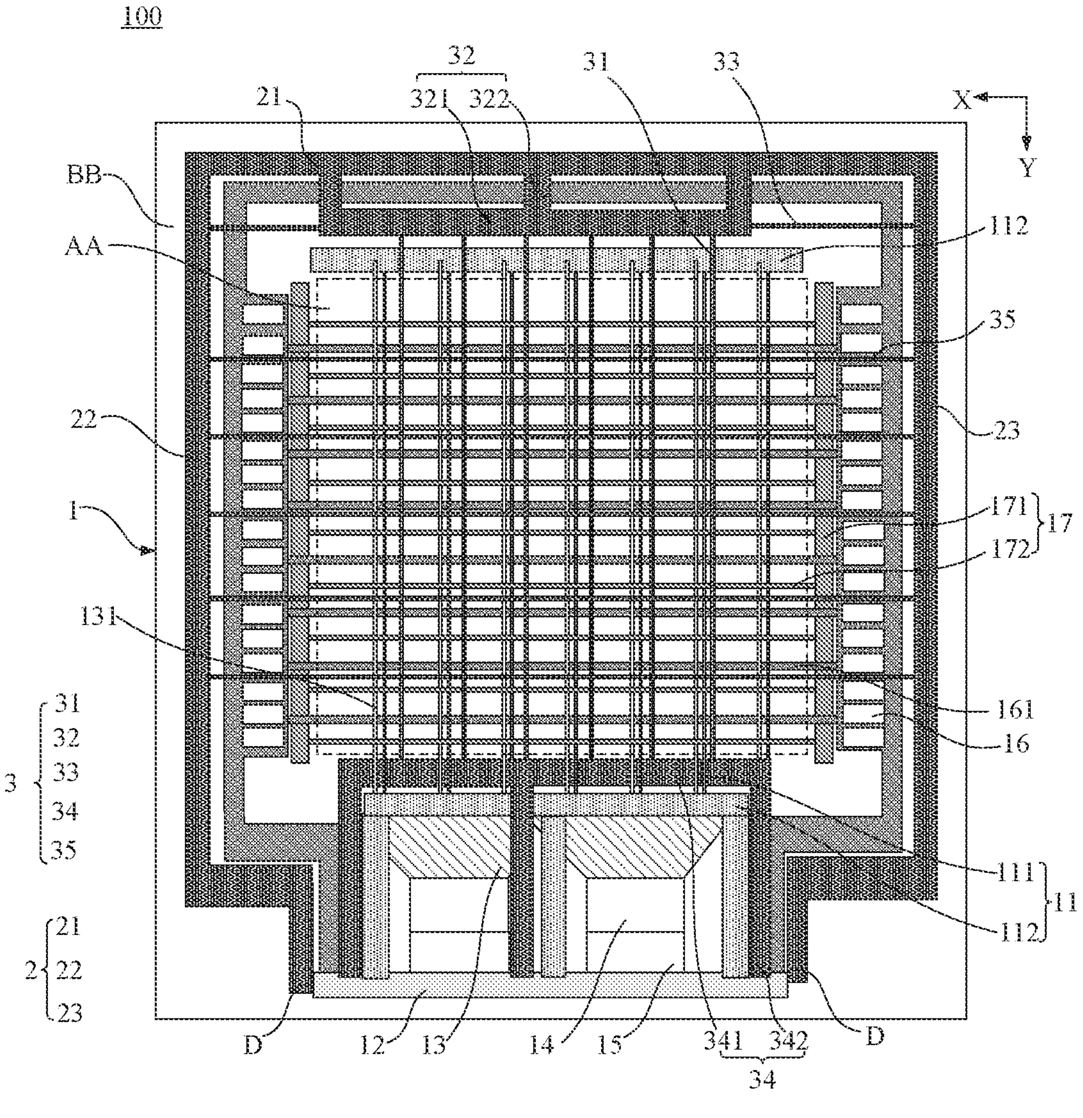
FIG. 4 is a structural diagram of another array substrate, in accordance with some embodiments.
Figure 5:
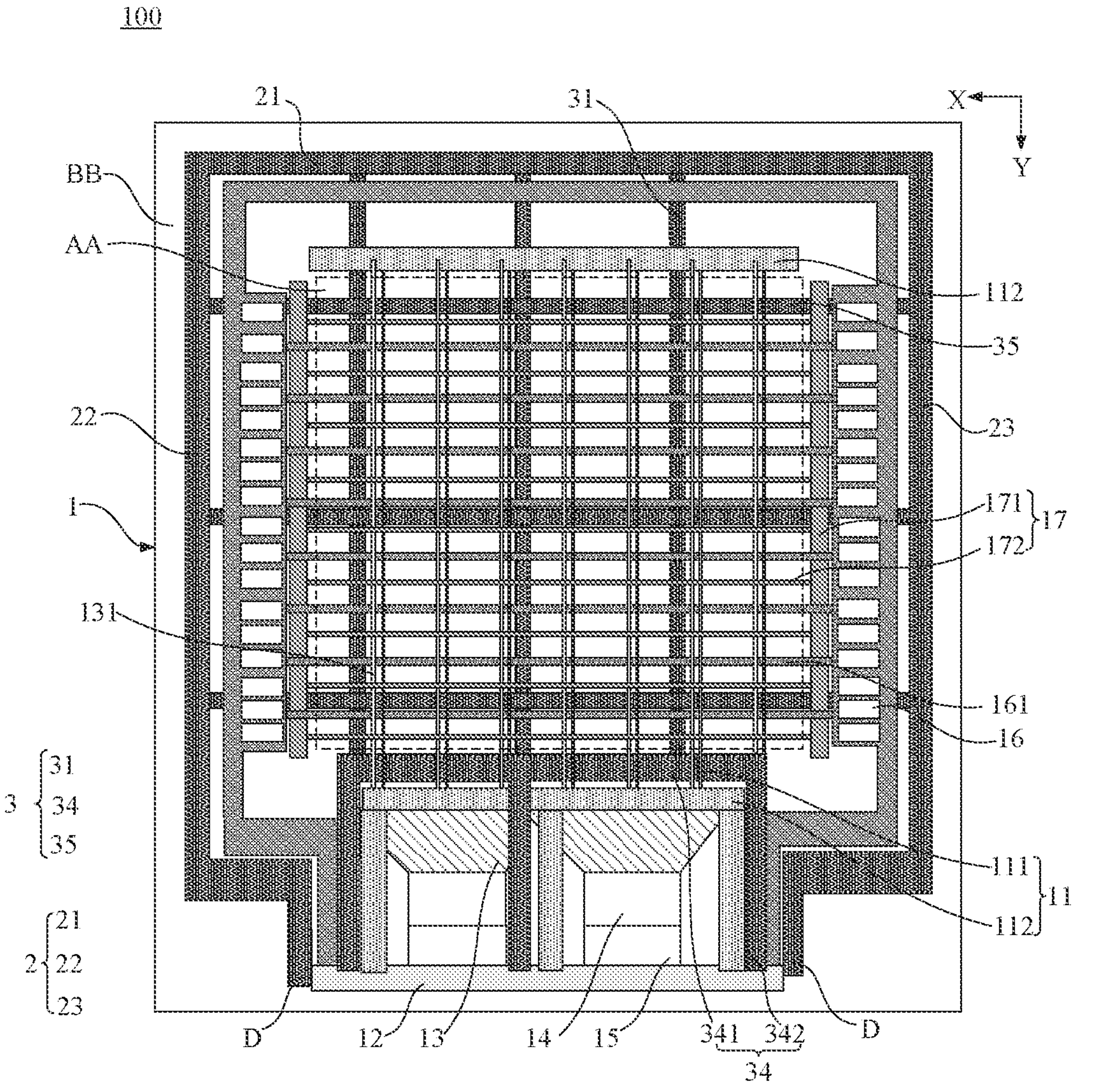
FIG. 5 is a structural diagram of yet another array substrate, in accordance with some embodiments.

In some embodiments, with continued reference to FIGS. 3 to 5, the voltage signal introduction structure 3 includes at least one first auxiliary voltage line 31. The first auxiliary voltage line 31 passes through the display area AA, a first end of the first auxiliary voltage line 31 is electrically connected to the first portion 21, and a second end of the first auxiliary voltage line 31 is located on the same side of the display area AA as the two ends D of the first common voltage line 2.

It can be understood that, after the voltage signal is input to the second end of the first auxiliary voltage line 31, the voltage signal is transmitted to the first end through the first auxiliary voltage line 31. Since the first auxiliary voltage line 31 is electrically connected to the first portion 21 of the first common voltage line 2, the voltage signal on the first auxiliary voltage line 31 is transmitted to the first portion 21, which raises the current at the position away from the signal input terminal. In addition, the second end of the first auxiliary voltage line 31 and the two ends D of the first common voltage line 2 are located on the same side of the display area AA, and thus they may share a signal input structure. As a result, there is no need to add an additional structure, which facilitates arrangement.

In some examples, a plurality of first auxiliary voltage lines 31 are provided. Widths of the plurality of first auxiliary voltage lines 31 may be equal or unequal. The plurality of first auxiliary voltage lines 31 are arranged at intervals. An arrangement range of the plurality of first auxiliary voltage lines 31 may cover the entire display area AA or only part of the display area AA.

In some embodiments, with continued reference to FIGS. 3 and 4, the voltage signal introduction structure 3 further includes first conductive connection portion(s) 32 located between the first portion 21 and the display area AA. The first end of the first auxiliary voltage line 31 is electrically connected to the first portion 21 through a first conductive connection portion 32.

With continued reference to FIGS. 3 and 4, the first conductive connection portion 32 is a structure extending from the peripheral area BB towards the display area AA. By providing the first conductive connection portion 32, it may be possible to achieve an electrical connection between the first auxiliary voltage line 31 and the first portion 21 of the first common voltage line 2 through the first conductive connection portion 32, and help determine the position and range for arranging the first auxiliary voltage line 31 through the first conductive connection portion 32. The first conductive connection portion 32 may be arranged at any position between the first portion 21 and the display area AA. A length of the first conductive connection portion 32 along an extension direction X of the first portion 21 may be the same as or smaller than a length of the first portion 21.

In some examples, the number of the first conductive connection portion(s) 32 is not specifically limited, and the number of the first conductive connection portion(s) 32 may be one or more. For example, with continued reference to FIGS. 3 and 4, one first conductive connection portion 32 is provided, and six first auxiliary voltage lines 31 arranged at intervals are electrically connected to the one first conductive connection portion 32. In some other examples, in a case where first auxiliary voltage lines 31 need to be provided at different positions, multiple first conductive connection portions 32 may be provided at intervals.

In some embodiments, with continued reference to FIGS. 3 and 4, the first conductive connection portion 32 includes a first connection line 321 and a plurality of second connection lines 322. The first connection line 321 and the first portion 21 are arranged at an interval. The plurality of second connection lines 322 each are connected between the first connection line 321 and the first portion 21. The first end of the first auxiliary voltage line 31 is connected to the first connection line 321.

It can be understood that, each second connection line 322 is equivalent to a signal input port, and the first connection line 321 being connected to the first portion 21 of the first common voltage line 2 through the plurality of second connection lines 322 is equivalent to the first portion 21 of the first common voltage line 2 being provided with a plurality of signal input ports thereon. Currents on the first auxiliary voltage lines 31 are transmitted to the first portion 21 of the first common voltage line 2 through the first connection line 321 and then through the plurality of second connection lines 322, thereby performing current compensation for a certain portion of the first portion 21.

In some examples, widths of the first connection line 321 and the second connection line 322 are equal to a width of the first portion 21 of the first common voltage line 2, and the width of the first auxiliary voltage line 31 is smaller than any one of the width of the first portion 21 of the first common voltage line 2, a width of the first connection line 321 and a width of the second connection line 322. In this way, it may be possible to ensure that the first connection line 321 and the second connection line 322 have large widths, so that their resistances are small, which may avoid loss of a large amount of current caused by a large IR drop. In addition, the first auxiliary voltage line 31 has a small width, which may facilitate an arrangement of the first auxiliary voltage lines 31 across the display area AA. As a result, affection on an aperture ratio of pixels in the display area AA is avoided.

In some embodiments, with continued reference to FIGS. 3 and 4, the plurality of second connection lines 322 are arranged at equal intervals along the extension direction X of the first portion 21.

With this arrangement (i.e., along the extension direction X of the first portion 21, by providing the certain portion of the first portion 21 with the plurality of signal input ports thereon uniformly), it may be possible to perform uniform current compensation for the first common voltage line 2 along the extension direction X of the first portion 21.

In some examples, the first connection line 321 and the first portion 21 of the first common voltage line 2 are arranged in parallel and have the interval therebetween. In this way, it facilitates fabrication and connection. The number of the second connection lines 322 is three, the second connection lines 322 are arranged at equal intervals along the extension direction X of the first portion 1, and the second connection lines 322 are arranged perpendicular to both the first portion 21 of the first common voltage line 2 and the first connection line 321.

In some embodiments, with continued reference to FIGS. 3 and 4, the voltage signal introduction structure 3 further includes at least one second auxiliary voltage line 33 extending in the same direction as the first portion 21. The first common voltage line 2 further includes a second portion 22 and a third portion 23 that are disposed opposite to each other. A first end of a second auxiliary voltage line 33 is connected to the second connection line 322, and a second end of the second auxiliary voltage line 33 is connected to the second portion 22 or the third portion 23.

For example, referring to FIGS. 3 and 4, an upper left corner and an upper right corner of the array substrate 100 each are provided with one second auxiliary voltage line 33 therein.

It can be understood that, the second end of the second auxiliary voltage line 33 being connected to the second portion 22 or the third portion 23 of the first common voltage line 2 is equivalent to the second portion 22 or the third portion 23 being provided with a signal input port thereon. It can be seen from FIGS. 3 and 4 that, the second auxiliary voltage lines 33 are arranged at two corners on a side away from the signal input terminals (i.e., the two ends D) of the first common voltage line 2, respectively. Since the corners are farther away from the signal input terminals, problems of an increased IR drop and a reduced current are easy to occur. Therefore, by providing the second auxiliary voltage lines 33 at these positions, it may compensate for currents at these positions.

In some embodiments, with continued reference to FIGS. 3 to 5, the voltage signal introduction structure 3 further includes a second conductive connection portion 34 located between the two ends D of the first common voltage line 2. The second end of the first auxiliary voltage line 31 is electrically connected to the second conductive connection portion 34.

It can be understood that, an end of the second conductive connection portion 34 is connected to a bonding pad 12, and another end of the second conductive connection portion 34 is connected to the cathode of the OLED, so as to provide the VSS voltage for the cathode of the OLED. The two ends D of the first common voltage line 2 are arranged at an interval, and the second conductive connection portion 34 is disposed between the two ends D, so that the first common voltage line 2 and the second conductive connection portion 34 together surround the display area AA. In a case where the display area AA is large, by arranging the second conductive connection portion, it may be possible to provide a more stable and uniform cathode voltage to the cathode of the OLED.

Based on this, the first auxiliary voltage line 31 may be connected to the second conductive connection portion 34, so as to transmit the current on the second conductive connection portion 34 to the first portion 21 of the first common voltage line 2.

In some embodiments, with continued reference to FIGS. 3 to 5, the second conductive connection portion 34 includes a connection segment 341 and a plurality of voltage signal input segments 342. The connection segment 341 is located on a side of the display area AA away from the first portion 21. The plurality of voltage signal input segments 342 each are connected to the connection segment 341, and each extend to a side away from the display area AA. The second end of the first auxiliary voltage line 31 is connected to the connection segment 341.

It will be noted that, the plurality of voltage signal input segments 342 are connected to bonding pads 12 to be input a cathode voltage signal, and the connection segment 341 is connected to the cathode of the OLED to transmit the cathode voltage signal to the cathode of the OLED.

In some examples, as shown in FIGS. 3 to 5, the connection segment 341 extends along the extension direction X of the first portion 21 of the first common voltage line 2. That is, the connection segment 341 is arranged parallel to the first portion 21. The number of the voltage signal input segments 342 is three, and the three voltage signal input segments 342 are arranged perpendicular to the connection segment 341; and the three voltage signal input segments 342 are arranged at equal intervals along the extension direction X of the connection segment 341, so that input currents may be more uniform.

In some embodiments, referring to FIGS. 4 and 5, the voltage signal introduction structure 3 further includes at least one third auxiliary voltage line 35, and the at least one third auxiliary voltage line 35 passes through the display area AA and crosses the first auxiliary voltage line 31. A first end of the third auxiliary voltage line 35 is connected to the second portion 22 of the first common voltage line 2, and a second end of the third auxiliary voltage line 35 is connected to the third portion 23 of the first common voltage line 2.

It will be noted that, by arranging the third auxiliary voltage line 35 crossing the first auxiliary voltage line 31, it may be possible to increase currents on the second portion 22 and the third portion 23 of the first common voltage line 2, thereby further improving uniformity of the currents at positions of the first common voltage line 2. As a result, the uniformity of the long-range brightness of the array substrate 100 is improved.

Similar to the first auxiliary voltage line(s) 31, one or more third auxiliary voltage lines 35 may be provided. In a case where a plurality of third auxiliary voltage lines 35 are provided, widths of the plurality of third auxiliary voltage lines 35 may be equal or unequal. The plurality of third auxiliary voltage lines 35 are arranged at intervals. An arrangement range of the third auxiliary voltage lines 35 may cover the entire display area AA or part of the display area AA. For example, the third auxiliary voltage lines 35 are disposed in a certain area proximate to the first portion 21 of the first common voltage line 2, so as to increase currents at ends of the second portion 22 and the third portion 23 away from the two ends D.

In some examples, with continued reference to FIG. 4, a width of the third auxiliary voltage line 35 is equal to both the width of the first auxiliary voltage line 31 and a width of the second auxiliary voltage line 33.

In some embodiments, with continued reference to FIGS. 4 and 5, the third auxiliary voltage line 35 and the first auxiliary voltage line 31 are electrically connected at a crossing position.

It will be noted that, by making the third auxiliary voltage line 35 and the first auxiliary voltage line 31 be electrically connected at the crossing position, it may be possible to ensure that currents of the two auxiliary voltage lines are equal at the crossing position, thereby helping improve the uniformity of the currents at the positions.

In some examples, in a case where crossing positions exist between the third auxiliary voltage line 35 and the first auxiliary voltage lines 31, the third auxiliary voltage line 35 and the first auxiliary voltage lines 31 may be electrically connected at a crossing position, or at multiple crossing positions, or at all the crossing positions. In a case where the third auxiliary voltage line 35 and the first auxiliary voltage lines 31 are not electrically connected at the crossing positions, it is equivalent to the third auxiliary voltage line 35 being connected in parallel with the first common voltage line 2, which facilitates reduction of an overall resistance and increase of the current on the first common voltage line 2.

In some examples, the first conductive connection portion 32 and the second conductive connection portion 34 are disposed in the same layer as the first common voltage line 2. In a case where the first auxiliary voltage line 31 and the third auxiliary voltage line 35 are disposed in the same layer as the first common voltage line 2, two ends of the first auxiliary voltage line 31 are directly connected to the first conductive connection portion 32 and the second conductive connection portion 34, respectively. In addition, the first auxiliary voltage line 31 and the third auxiliary voltage line 35 are directly electrically connected at the crossing position.

In some other examples, the first auxiliary voltage line 31 and the third auxiliary voltage line 35 are disposed in a different layer from the first common voltage line 2. Since the first conductive connection portion 32 and the second conductive connection portion 34 are disposed in the same layer as the first common voltage line 2, in this case, the two ends of the first auxiliary voltage line 31 are electrically connected to the first conductive connection portion 32 and the second conductive connection portion 34 through via holes, respectively. Alternatively, an end of the first auxiliary voltage line 31 is directly electrically connected to the first common voltage line 2 through a via hole. Similarly, in a case where the first auxiliary voltage line 31 and the third auxiliary voltage line 35 are disposed in different layers, if the first auxiliary voltage line 31 and the third auxiliary voltage line 35 need to be electrically connected at the crossing position, they are electrically connected at the crossing position through a via hole.

It can be understood that, the first auxiliary voltage line(s) 31 and the third auxiliary voltage line(s) 35 may be disposed in different layers of the array substrate 100 according to production processes, wiring requirements, etc. In this way, it may be possible to increase the numbers of the first auxiliary voltage lines 31 and the third auxiliary voltage lines 35. In addition, widths of the first auxiliary voltage line 31 and the third auxiliary voltage line 35 in different layers may be set larger, which helps further increase the input current, facilitates full use of a space of the array substrate 100, and is applied to the array substrate 100 of various structures.

In some embodiments, in all first auxiliary voltage lines 31, part of the first auxiliary voltage lines 31 are disposed in the same layer as the first common voltage line 2, and remaining part of the first auxiliary voltage lines 31 are disposed in a different layer from the first common voltage line 2; or in all third auxiliary voltage lines 35, part of the third auxiliary voltage lines 35 are disposed in the same layer as the first common voltage line 2, and remaining part of the third auxiliary voltage lines 35 are disposed in a different layer from the first common voltage line 2; or the part of the first auxiliary voltage lines 31 are disposed in the same layer as the first common voltage line 2, the remaining part of the first auxiliary voltage lines 31 are disposed in the different layer from the first common voltage line 2, the part of the third auxiliary voltage lines 35 are disposed in the same layer as the first common voltage line 2, and the remaining part of the third auxiliary voltage lines 35 are disposed in the different layer from the first common voltage line 2.

It can be understood that, in the case where the plurality of first auxiliary voltage lines 31 are provided, the plurality of first auxiliary voltage lines 31 may be disposed in different layers. Similarly, in the case where the plurality of third auxiliary voltage lines 35 are provided, the plurality of third auxiliary voltage lines 35 may also be disposed in different layers. In this way, it may be possible to increase manners in which the first auxiliary voltage lines 31 and the third auxiliary voltage lines 35 are arranged, and may be applied to different structures of the array substrate 100.

In some examples, in a case where a first auxiliary voltage line 31 and the first common voltage line 2 are disposed in different layers, the width of the first auxiliary voltage line 31 disposed in a different layer from the first common voltage line 2 may be greater than a width of a first auxiliary voltage line 31 disposed in the same layer as the first common voltage line 2. By increasing the width of the first auxiliary voltage line, it may be possible to reduce a resistance of the first auxiliary voltage line 31 and reduce an IR drop of the first auxiliary voltage line 31. Similarly, a width of a third auxiliary voltage line 35 disposed in a different layer from the first common voltage line 2 may be greater than a width of a third auxiliary voltage line 35 disposed in the same layer as the first common voltage line 2.

In some embodiments, referring to FIG. 2, the array substrate 100 further includes: a circuit structure layer 4 located on the first side of the substrate 1, an anode layer (e.g., a layer where first electrodes 101*a* or second electrodes 101*b* are located) located on a side of the circuit structure layer 4 away from the substrate 1, and a light-shielding metal layer 5 located between the circuit structure layer 4 and the substrate 1. The circuit structure layer 4 includes at least one conductive layer (e.g., a first source-drain metal layer 41 and a second source-drain metal layer 42 hereinafter). The first common voltage line 2 is disposed in the same layer as any one of the at least one conductive layer and the anode layer. Referring to FIGS. 2 and 5, first auxiliary voltage line(s) 31 or third auxiliary voltage line(s) 35 disposed in a different layer from the first common voltage line 2 are disposed in a same layer as the light-shielding metal layer 5.

With continued reference to FIG. 2, the circuit structure layer 4 and the anode layer are disposed in the display area AA. The circuit structure layer 4 is used to arrange the pixel driving circuits. The pixel driving circuit may have various structures, which is not limited in the embodiments of the present disclosure. For example, the pixel driving circuit may have a "2T1C" structure, a "6T1C" structure, a "7T1C" structure, a "6T2C" structure, a "7T2C" structure, or the like. "T" represents a thin film transistor, the number before "T" represents the number of thin film transistors, "C" represents a storage capacitor, and the number before "C" represents the number of storage capacitors. In addition, the pixel driving circuit may include a thin film transistor with a single-gate structure (e.g., a bottom-gate structure or a top-gate structure), or a thin film transistor with a double-gate structure, or the thin film transistor with the single-gate structure (e.g., the bottom-gate structure or the top-gate structure) and the thin film transistor with the double-gate structure. Therefore, the conductive layers in the circuit structure layer 4 include at least source-drain metal layers and a gate layer.

In some examples, with continued reference to FIG. 2, the circuit structure layer 4 is provided with the first source-drain metal layer 41 and the second source-drain metal layer 42 therein. Referring to FIGS. 2 and 5, the first common voltage line 2 is disposed in the same layer as any one of the source-drain metal layers, the first auxiliary voltage line(s) 31 and the third auxiliary voltage line(s) 35 are all disposed in the same layer as the first common voltage line 2. In addition, the second auxiliary voltage line(s) 33 are also disposed in the same layer as the first common voltage line 2.

With continued reference to FIG. 2, the array substrate 100 is provided with the light-shielding metal layer 5 therein, and the light-shielding metal layer 5 is used to prevent light from being irradiated to an active layer 43 of the circuit structure layer 4, so as to prevent electric leakage of transistors M in the circuit structure layer 4. In some examples, referring to FIGS. 2 and 5, the first auxiliary voltage lines 31 and the third auxiliary voltage lines 35 are all disposed in the same layer as the light-shielding metal layer 5, the first auxiliary voltage lines 31 are connected to the first portion 21 of the first common voltage line 2, and the widths of the first auxiliary voltage lines 31 and the third auxiliary voltage lines 35 are all equal, thereby facilitating fabrication and arrangement. In addition, a layer where the light-shielding metal layer 5 is located have a large space, in this case, the widths of the first auxiliary voltage lines 31 and the third auxiliary voltage lines 35 may be greater than the widths thereof in the case where the first auxiliary voltage lines 31 and the third auxiliary voltage lines 35 are disposed in the same layer as the first common voltage line 2. Due to the increased line width, the IR drop of the line may be reduced, and thus current loss may be reduced.

Figure 6:
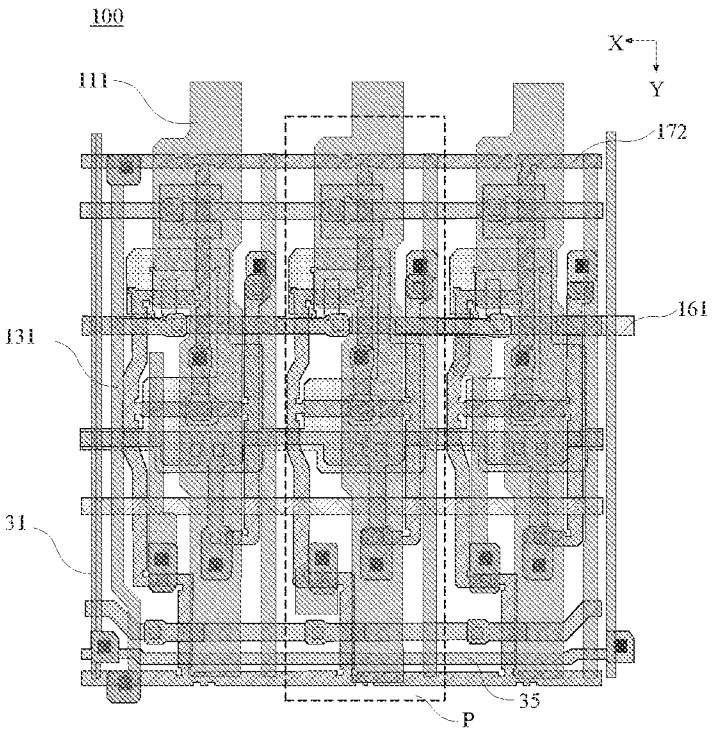
FIG. 6 is a diagram showing a layout of an array substrate, in accordance with some embodiments.
Figure 7:
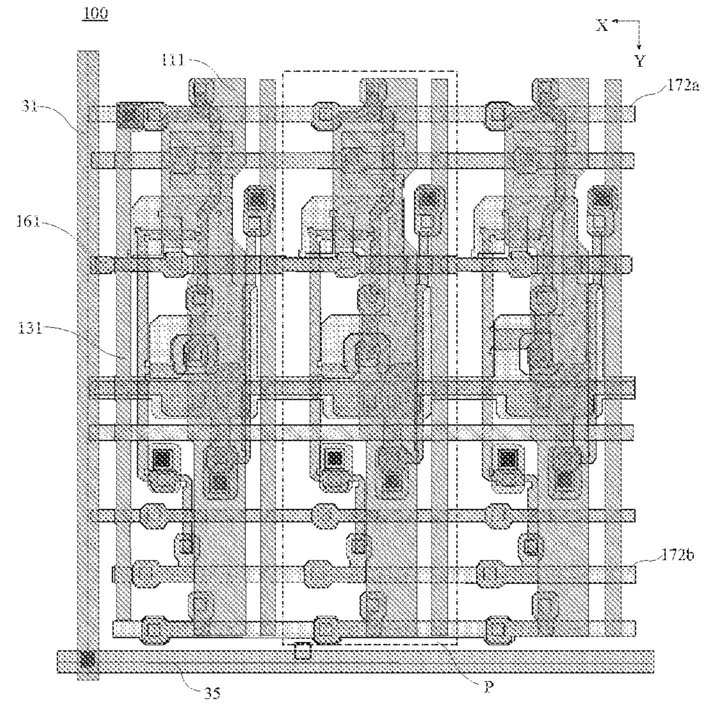
FIG. 7 is a diagram showing a layout of another array substrate, in accordance with some embodiments.

In some embodiments, referring to FIGS. 6 and 7, the display area AA includes a plurality of sub-pixel regions P, and the plurality of sub-pixel regions P are arranged in a plurality of rows and a plurality of columns. The first auxiliary voltage line 31 and the third auxiliary voltage line 35 each pass through the display area AA through gaps between sub-pixel regions P.

In this way, wiring of the first auxiliary voltage line 31 and the third auxiliary voltage line 35 may not affect image display on the display area AA, and the first auxiliary voltage line 31 and the third auxiliary voltage line 35 may be regularly wired. For example, referring to FIGS. 3 to 5, the first auxiliary voltage line 31 extends along a Y direction, and the third auxiliary voltage line 35 extends along an X direction. In some other examples, the first auxiliary voltage line 31 and the third auxiliary voltage line 35 may be irregularly wired. For example, the first auxiliary voltage line 31 extends along the Y direction, and is alternately convex and concave along the X direction.

It can be understood that, FIGS. 6 and 7 illustrate a case where the sub-pixel regions P are arranged in one row and three columns. In actual products, the sub-pixel regions P may be arranged in the plurality of rows (e.g., 1024 rows) and the plurality of columns (e.g., 2048 columns). The plurality of sub-pixel regions P may include at least one sub-pixel region of a first color, at least one sub-pixel region of a second color and at least one sub-pixel region of a third color. The first color, the second color and the third color are three primary colors (e.g., red, green and blue). The sub-pixel region P is used to arrange the pixel driving circuit and the light-emitting device. The array substrate 100 may achieve image display by driving the light-emitting devices to emit light by the pixel driving circuits.

In some embodiments, all the first auxiliary voltage lines 31 are arranged at equal intervals along a row direction (i.e., the X direction) of the plurality of sub-pixel regions P; or all the third auxiliary voltage lines 35 are arranged at equal intervals along a column direction (i.e., the Y direction) of the plurality of sub-pixel regions P; or all the first auxiliary voltage lines 31 are arranged at equal intervals along the row direction (i.e., the X direction) of the plurality of sub-pixel regions P and all the third auxiliary voltage lines 35 are arranged at equal intervals along the column direction (i.e., the Y direction) of the plurality of sub-pixel regions P.

In this way, it may be possible to ensure that the first auxiliary voltage lines 31 and the third auxiliary voltage lines 35 are uniformly arranged in the array substrate 100, thereby facilitating fabrication and further improving the uniformity of the currents.

For example, one sub-pixel region P may be disposed between two adjacent first auxiliary voltage lines 31, or three or five sub-pixel regions P may be disposed between two adjacent first auxiliary voltage lines 31. For an arrangement of the third auxiliary voltage lines 35, reference may be made to the arrangement of the first auxiliary voltage lines 31. With continued reference to FIGS. 6 and 7, the first auxiliary voltage line 31 and the third auxiliary voltage line 35 cross, and are electrically connected at the crossing position. The sub-pixel region is provided with a portion of one initialization signal line 172 therein in FIG. 6. The sub-pixel region is provided with portions of two initialization signal lines (i.e., **172*a* and 172*b*) therein in FIG. 7**.

Figure 8:
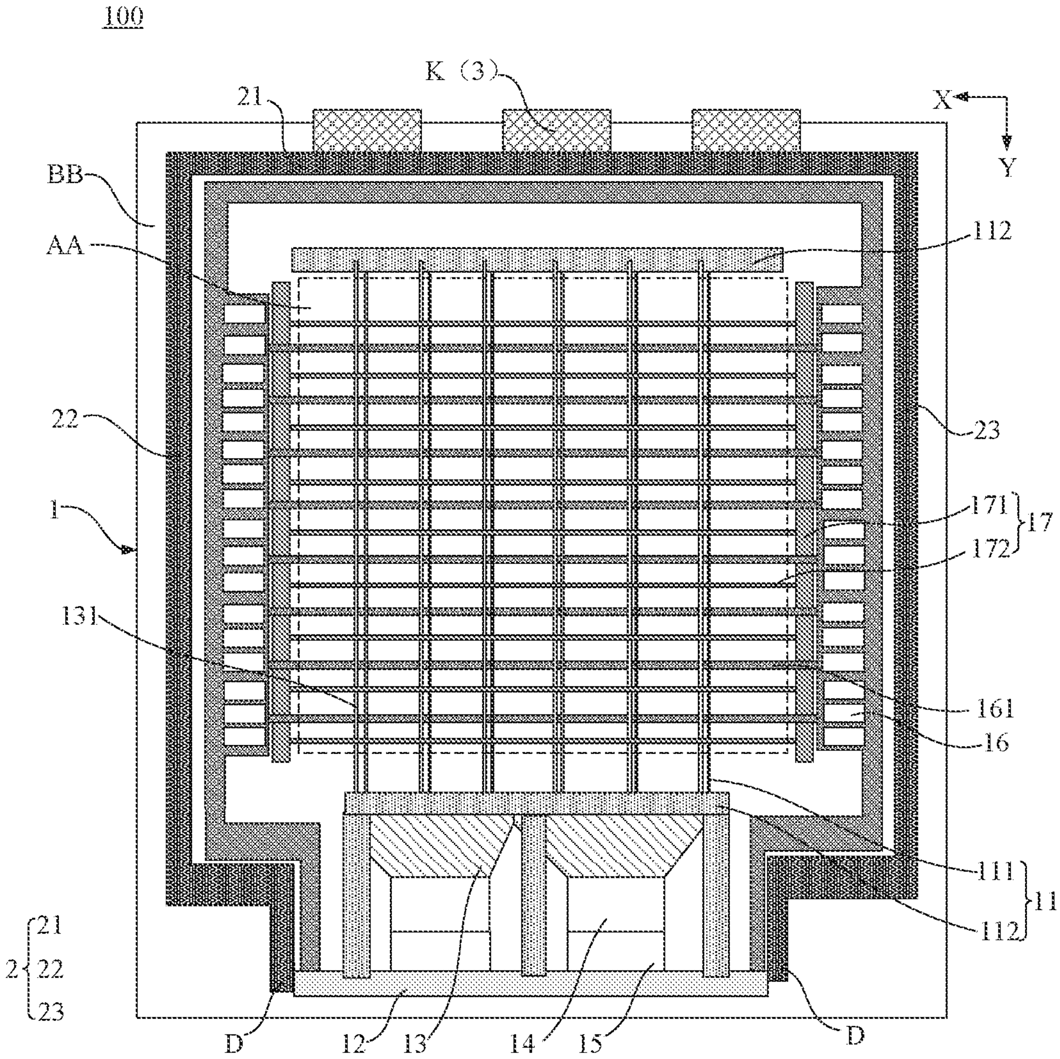
FIG. 8 is a structural diagram of yet another array substrate, in accordance with some embodiments.

In some embodiments, referring to FIG. 8, the voltage signal introduction structure 3 includes at least one connection block K located on a side of the first portion 21 away from the display area AA. In addition, the at least one connection block K is connected to the first portion 21. The connection block K is configured to be connected to an external voltage signal source.

In these embodiments, the voltage signal introduction structure 3 takes a form of the connection block, and each connection block K is equivalent to the voltage signal input port, and may input a signal provided by the external voltage signal source to the first common voltage line 2, thereby compensating for the IR drop of the first common voltage line 2, and improving the uniformity of the currents on the first common voltage line 2. In addition, the connection block K is disposed on the side of the first portion 21 away from the display area AA, and in a case where the connection block K is connected to the external voltage signal source, there may be no need for wire(s) to pass through the display area AA, which ensures that the structure of the display area AA is unchanged.

In some examples, the connection block is electrically connected to the driver IC through the flexible printed circuit to transmit the signal to the first common voltage line 2.

In some embodiments, a plurality of connection blocks K are provided, the connection blocks K are connected to different positions of the first portion 21, and the connection blocks K are arranged at equal intervals along the extension direction of the first portion.

In this way, the connection blocks K may be uniformly arranged within an arrangement range, thereby facilitating fabrication and improving the uniformity of the currents. It will be noted that, the connection blocks K may be arranged only on a certain portion of the first portion 21 along the extension direction of the first portion 21 according to current boosting requirements, so as to focus on boosting the current on the portion the first portion 21. In addition, the connection blocks K may also be uniformly arranged on the entire first portion 21 along the extension direction of the first portion 21.

In summary, for the display apparatus 1000 and the array substrate 100 provided in the embodiments of the present disclosure, since the voltage signal introduction structure 3 is provided, voltage signals may be input to the first common voltage line 2 from the positions, thereby ameliorating the defects of the existing structure caused by inputting the voltage signal from one side, reducing local heat generation of the structure, improving the uniformity of the currents, and improving the uniformity of the long-range brightness.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate having a display area and a peripheral area, the array substrate comprising:
- a substrate;
- a first common voltage line disposed on a first side of the substrate, the first common voltage line being located in the peripheral area and arranged along at least part of a boundary of the display area;
- a voltage signal introduction structure disposed on the first side of the substrate, the voltage signal introduction structure being electrically connected to at least one position except two ends of the first common voltage line, so as to input a voltage signal to the first common voltage line; and
- a plurality of bonding pads disposed on the first side of the substrate, the two ends of the first common voltage line being electrically connected to respective bonding pads, wherein
- the two ends of the first common voltage line are located on a same side of the display area, and the two ends of the first common voltage line are both signal input terminals;
- the first common voltage line includes a first portion, and the first portion is located on a side of the display area away from the two ends;
- the voltage signal introduction structure is electrically connected to at least one position of the first portion; and
- the voltage signal introduction structure includes:
  - at least one first auxiliary voltage line passing through the display area, wherein in the at least one first auxiliary voltage line, a first end of a first auxiliary voltage line is electrically connected to the first portion, and a second end of the first auxiliary voltage line is located on the same side of the display area as the two ends of the first common voltage line;
  - a second conductive connection portion located between the two ends of the first common voltage line, the second end of the first auxiliary voltage line being electrically connected to the second conductive connection portion, and an end of the second conductive connection portion being connected to a bonding pad of the plurality of bonding pads; and
  - at least one third auxiliary voltage line passing through the display area and crossing the first auxiliary voltage line, wherein
  - the first common voltage line further includes a second portion and a third portion that are disposed opposite to each other; in the at least one third auxiliary voltage line, a first end of a third auxiliary voltage line is connected to the second portion, and a second end of the third auxiliary voltage line is connected to the third portion; and
- the array substrate further comprising:
  - a circuit structure layer located on the first side of the substrate, the circuit structure layer including at least one conductive layer;
  - an anode layer located on a side of the circuit structure layer away from the substrate; and
  - a light-shielding metal layer located between the circuit structure layer and the substrate, wherein
  - the first common voltage line is disposed in a same layer as any one of the at least one conductive layer and the anode layer; and
  - one of the at least one first auxiliary voltage line or one of the at least one third auxiliary voltage line disposed in a different layer from the first common voltage line is disposed in a same layer as the light-shielding metal layer.

2. The array substrate according to claim 1, wherein the voltage signal introduction structure further includes:
- a first conductive connection portion located between the first portion and the display area, wherein
- the first end of the first auxiliary voltage line is electrically connected to the first portion through the first conductive connection portion.

3. The array substrate according to claim 2, wherein the first conductive connection portion includes:
- a first connection line, the first connection line and the first portion being arranged at an interval; and
- a plurality of second connection lines each connected between the first connection line and the first portion, wherein
- the first end of the first auxiliary voltage line is connected to the first connection line.

4. The array substrate according to claim 3, wherein the plurality of second connection lines are arranged at equal intervals along an extension direction of the first portion.

5. The array substrate according to claim 3, wherein the voltage signal introduction structure further includes:
- at least one second auxiliary voltage line extending in a same direction as the first portion, wherein
- the first common voltage line further includes a second portion and a third portion that are disposed opposite to each other; in the at least one second auxiliary voltage line, a first end of a second auxiliary voltage line is connected to a second connection line in the plurality of second connection lines, and a second end of the second auxiliary voltage line is connected to the second portion or the third portion.

6. The array substrate according to claim 1, wherein the second conductive connection portion includes:
- a connection segment located on a side of the display area away from the first portion; and
- a plurality of voltage signal input segments each connected to the connection segment and each extending to a side away from the display area, wherein
- the second end of the first auxiliary voltage line is connected to the connection segment.

7. The array substrate according to claim 1, wherein
- the third auxiliary voltage line and the first auxiliary voltage line are electrically connected at a crossing position.

8. The array substrate according to claim 1, wherein
- the at least one first auxiliary voltage line and the at least one third auxiliary voltage line are disposed in a different layer from the first common voltage line.

9. The array substrate according to claim 1, wherein
- the at least one first auxiliary voltage line includes a plurality of first auxiliary voltage lines, part of the first auxiliary voltage lines are disposed in a same layer as the first common voltage line, and remaining part of the first auxiliary voltage lines are disposed in a different layer from the first common voltage line; or
- the at least one third auxiliary voltage line includes a plurality of third auxiliary voltage lines, part of the third auxiliary voltage lines are disposed in the same layer as the first common voltage line, and remaining part of the third auxiliary voltage lines are disposed in a different layer from the first common voltage line; or the part of the first auxiliary voltage lines are disposed in the same layer as the first common voltage line, and the remaining part of the first auxiliary voltage lines are disposed in the different layer from the first common voltage line, the part of the third auxiliary voltage lines are disposed in the same layer as the first common voltage line, and the remaining part of the third auxiliary voltage lines are disposed in the different layer from the first common voltage line.

10. The array substrate according to claim 1, wherein the display area includes a plurality of sub-pixel regions arranged in a plurality of rows and a plurality of columns, wherein the first auxiliary voltage line and the third auxiliary voltage line each pass through the display area through gaps between sub-pixel regions in the plurality of sub-pixel regions.

11. The array substrate according to claim 10, wherein the at least one first auxiliary voltage line includes a plurality of first auxiliary voltage lines, the plurality of first auxiliary voltage lines are arranged at equal intervals along a row direction of the plurality of sub-pixel regions; or the at least one third auxiliary voltage line includes a plurality of third auxiliary voltage lines, the plurality of third auxiliary voltage lines are arranged at equal intervals along a column direction of the plurality of sub-pixel regions; or the plurality of first auxiliary voltage lines are arranged at equal intervals along the row direction of the plurality of sub-pixel regions, and the plurality of third auxiliary voltage lines are arranged at equal intervals along the column direction of the plurality of sub-pixel regions.

12. A display apparatus, comprising:

the array substrate according to claim 1.

* * * * *